United States Patent
West

(10) Patent No.: US 6,285,963 B1
(45) Date of Patent: Sep. 4, 2001

(54) MEASURING SIGNALS IN A TESTER SYSTEM

(75) Inventor: Burnell G. West, Fremont, CA (US)

(73) Assignee: Schlumberger Technologies, Inc., San Jose, CA (US)

(*) Notice: Subject to any disclaimer, the term of this patent is extended or adjusted under 35 U.S.C. 154(b) by 0 days.

(21) Appl. No.: 09/452,058

(22) Filed: Nov. 30, 1999

Related U.S. Application Data

(62) Division of application No. 08/949,747, filed on Oct. 14, 1997, now Pat. No. 6,081,484.

(51) Int. Cl.[7] ...................................................... G04F 8/00
(52) U.S. Cl. ........................ 702/117; 714/736; 714/718; 714/712
(58) Field of Search ........................... 702/117; 358/518; 348/624; 714/736, 712, 718

(56) References Cited

U.S. PATENT DOCUMENTS

| | | |
|---|---|---|
| 5,268,760 * | 12/1993 | Suyama ................................ 358/167 |
| 5,428,648 | 6/1995 | Fukuda . |
| 5,444,695 * | 8/1995 | Copley et al. ........................ 370/17 |
| 5,717,704 | 2/1998 | Rosenfeld ............................ 714/738 |
| 6,081,484 * | 6/2000 | West .................................... 714/736 |

* cited by examiner

Primary Examiner—Kamini Shah
(74) Attorney, Agent, or Firm—Fish & Richardson P.C.

(57) ABSTRACT

Apparatus and method for measuring the time interval between a first event and a second event in a tester system. First and second time measurement circuits independently receive respective first and second events. The time measurement circuits each includes a coarse counter clocked by the master clock. The first coarse counter is activated by an initial event, and the first coarse counter stops counting upon activation of the first event. The second coarse counter is also activated by the initial event, and the second coarse counter stops counting upon activation of the second event. A first fine counter clocked by the master clock produces a count value representing the time interval between the first event and a first leading edge of the master clock. A second fine counter clocked by the master clock produces a count value representing the time interval between the second event and a second leading edge of the master clock.

5 Claims, 9 Drawing Sheets

MEASURING SIGNALS IN A TESTER SYSTEM

This application is a divisional (and claims the benefit of priority under 356 USC 120) of U.S. application Ser. No. 08/949,747, filed Oct. 14, 1997, now U.S. Pat. No. 6,081,484. The disclosure of the prior application is considered part of (and is incorporated by reference) the disclosure of this application.

BACKGROUND

The invention relates to measuring signals in a tester system.

Tester systems for testing high speed devices, such as microprocessors and microcontrollers, have increasingly become more sophisticated due to high speed requirements. Referring to FIG. 1, a prior art timing measurement unit (TMU) 20 is used in a tester system 8, such as the ITS 90000GX system made by Schlumberger Technologies, Inc. A device under test (DUT) 10 is connected to a pin electronics (PE) card 12 in the tester system 8. The PE card translates signals received in the tester system 8 into DUT logic levels and converts signals received from the DUT 10 to test system signals, such as formatted ECL wave forms. Signals from the PE card 12 are passed to pin slice electronics cards 14, which in turn drive signals that are transmitted to corresponding high speed interface cards 16. Each high speed interface card 16 outputs a pair of signals HSPATHA and HSPATHB to a multiplexer 18, which selects the outputs from one of the high speed interface cards for output as signals MA and MB.

The selected pair of signals MA and MB are routed to TMU 20, which measures the time difference between signals MA and MB, or between corresponding pairs of signals from other sources 21 (such as signals used during calibration of the tester system 8).

Referring to FIGS. 2 and 3, the coarse difference between selected inputs TRIGA and TRIGB (which correspond to events to be measured, e.g., MA and MB) is measured by a coarse counter 110. The coarse counter 110 is clocked by a divide-by-four clock CCCLK having a frequency of about 62.5 megahertz (MHz), which is buffered from a divide-by-four clock CCLK from a programmable frequency divider 116. The coarse counter 110 starts counting on the first leading edge of CCCLK after activation of TRIGA and stops counting on the first leading edge of CCCLK after activation of TRIGB, thereby measuring the number of CCCLK clocks between TRIGA and TRIGB.

A 1 ps time measurement resolution between TRIGA and TRIGB is achieved by measuring the time difference between edges of the selected inputs TRIGA and TRIGB and the divided clock CCCLK (fine differences $T_{fa}$ and $T_{fb}$, respectively, in FIG. 2) using interpolators 102 and 104 that have a resolution of 1 ps.

To control the interpolators 102 and 104, an event error detector 100 receives signals TRIGA and TRIGB as well as divided clocks CCLK and DCLK, both running at about 62.5 MHz. The signals CCLK and DCLK from the programmable frequency divider 116 are divided down from a 312.5-MHz master clock PFDCK.

The event error detector 100 outputs signals INTERP_A (in response to activation of TRIGA) and INTERP_B (in response to activation of TRIGB), which are provided to the interpolators 102 and 104, respectively. As shown in FIG. 2, the signal INTERP_A is asserted high on the rising edge of the signal TRIGA. The signal INTERP_A is maintained high until the occurrence of the second rising edge of DCLK after the leading edge of INTERP_A. The signal INTERP_B is asserted high on the rising edge of TRIGB, and INTERP_B falls low on the second rising edge of DCLK after the leading edge of INTERP_B. This guarantees that the width of the signals INTERP_A and INTERP_B are between 16 nanoseconds (ns) and 32 ns.

In response to assertion of the signals INTERP_A and INTERP_B, the two interpolators 102 and 104 generate signals AEN and BEN, respectively, for enabling fine counters 114 and 112. Each of the fine counters 114 and 112 is clocked by ACLK, which runs at the system oscillator clock frequency of 312.5 MHz. The interpolators 102 and 104 effectively stretch the signals INTERP_A and INTERP_B by a factor of 3200 for output as fine counter enable signals AEN and BEN to achieve a fine resolution of 1 ps.

As shown in FIG. 4A, each interpolator includes a ramp circuit 120 and a comparator 122 for comparing the output of the ramp circuit 120 with a reference voltage. The comparator 122 outputs the enable signal AEN or BEN to the fine counter 114 or 112.

The ramp circuit 120 includes the circuitry shown in FIG. 4B, which includes a first current source 142 that outputs a tiny current (e.g., 10 $\mu$A), and a second, larger current source 144 capable of producing a relatively large current (e.g., 32 mA). The large current source 144 is connected to a node of a capacitor 140 by a switch 146, which is activated to ramp up the ramp circuit 120 in response to assertion of INTERP_A or INTERP_B. On assertion of INTERP_A (B), the large current source 144 quickly charges the capacitor 140. When INTERP_A (B) reaches a predetermined voltage, A(B)EN is activated. The capacitor 140 continues to charge until the signal INTERP_A(B) is negated, at which time the ramp circuit 120 ramps down. The charging period is shown as period $T_o$ in FIG. 4A.

During ramp down, the capacitor 140 is discharged by the tiny current source 142 at a much slower rate. The comparator 122 continues to drive the signal A(B)EN high until the capacitor 140 has discharged to a predetermined voltage, at which time the comparator 122 drives its output signal A(B) EN low. The discharge period is shown as period $T_1$ in FIG. 4A.

By using a large current source of 32 mA and a tiny current source of 10 $\mu$A, the ramp circuit 120 in effect stretches the input signal INTERP_A(B) by a factor of 3200. Since the fine counter 114 or 112 runs at 312.5 MHz, the resolution achieved is 1 ps (or 1/(312.5 MHz*3200)).

Upon completion of the measurement, the contents of the fine counters 112 and 114, clocked by ACLK, and the coarse counter 110, clocked by the divided signal CCCLK, are retrieved by a readback logic block 118. The time difference between events A and B, TIMEAtoB, is calculated according to Equation 1:

TIMEAtoB=(COUNTA*1 ps)

−(COUNTB*1 ps)

+(COUNTC*16 ns),                     Eq. (1)

where COUNTA is the value in the fine counter 114, COUNTB is the value in the fine counter 112, and COUNTC is the value in the coarse counter 110.

In effect, the interpolator 102 in combination with the fine counter 114 measures the time difference between the leading edge of INTERP_A and the next leading edge of the divided clock CCCLK (on which the coarse counter 110 is activated) at 1 ps resolution. Similarly, the interpolator 104 in combination with the fine counter 112 measures the time difference between the leading edge of INTERP_B and the next leading edge of CCCLK, on which the coarse counter 110 is stopped.

SUMMARY

Among the advantages of the invention is that improved timing measurement accuracy is achieved by using an independent measurement circuit (e.g., a coarse counter and an interpolator) to measure each of the timed events. In addition, by referencing time measurements to a master clock rather than a divided clock in a tester system, the likelihood of phase errors in the time measurements is reduced.

In general, in one aspect, the invention features a tester system having a master clock, a first coarse counter clocked by the master clock and connected to stop counting upon occurrence of a first event, and a second coarse counter clocked by the master clock and connected to stop counting upon occurrence of a second event. A fine measurement circuit clocked by the master clock is configured to measure the time intervals from occurrence of the first and second events to corresponding edges of the master clock.

In general, in another aspect, the invention features a method of measuring the time interval between a first event and a second event. The number of master clocks within a capture window between the first and second events is identified. A first fine time interval is determined between a first edge of the capture window and a first edge of the master clock. A second fine time interval is determined between a second edge of the capture window and a second edge of the master clock. Then, the time interval is calculated using the number of master clocks in the first and second fine time intervals.

In general, in another aspect, the invention features an apparatus for measuring the time interval between a first event and a second event in a tester system for testing a circuit. The apparatus includes a first measurement circuit responsive to a master clock and connected to measure the time between an initial event and the first event and a second measurement circuit responsive to the master clock and connected to measure the time between the initial event and the second event. A fine measurement circuit clocked by the master clock is configured to measure time intervals from occurrence of the first and second events to corresponding edges of the master clock.

In general, in another aspect, the invention features a method of measuring the time interval between a first event and a second event. The number of master clocks between occurrence of the first event and occurrence of the second event is counted. A first fine counter clocked by the master clock is used to count a value representing the time interval between the occurrence of the first event and a first leading edge of the master clock. A second fine counter clocked by the master clock is used to count a value representing the time interval between occurrence of the second event and a second leading edge of the master clock.

In general, in another aspect, the invention features an apparatus for measuring the time interval between a first event and a second event in a tester system. The apparatus includes a coarse counting device clocked by a master clock, the coarse counting device connected to measure the number of master clocks between occurrence of the first event and occurrence of the second event. First and second fine counters are clocked by the master clock. A first interpolator has a delay element that produces a first stop output that is delayed a predetermined number of master clocks from occurrence of the first event. The first interpolator produces a first enable signal responsive to the first event and the first stop output to enable the first fine counter. In addition, a second interpolator has a delay element that produces a second stop output that is delayed a predetermined number of master clocks from occurrence of the second event. The second interpolator produces a second enable signal responsive to the second event and the second stop output to enable the second fine counter.

In general, in another aspect, the invention features an interpolating circuit for use with a counter clocked by a master clock in a tester system. The interpolating circuit includes a shift register clocked by the master clock, the shift register having an input and an output. The input is coupled to an activation signal, and the output is coupled to a stop signal. A ramp circuit has a capacitor, the ramp circuit charging the capacitor in response to receipt of the activation signal. The ramp circuit discharges the capacitor in response to receipt of the stop signal. A signal driver is connected to the ramp circuit, the signal driver activating an enable signal to the counter when the capacitor is charged to a predetermined voltage.

Other features and advantages will become apparent from the following description and from the claims.

DETAILED DESCRIPTION

In the ensuing description, all referenced signals are differential unless otherwise noted.

Figure 1:
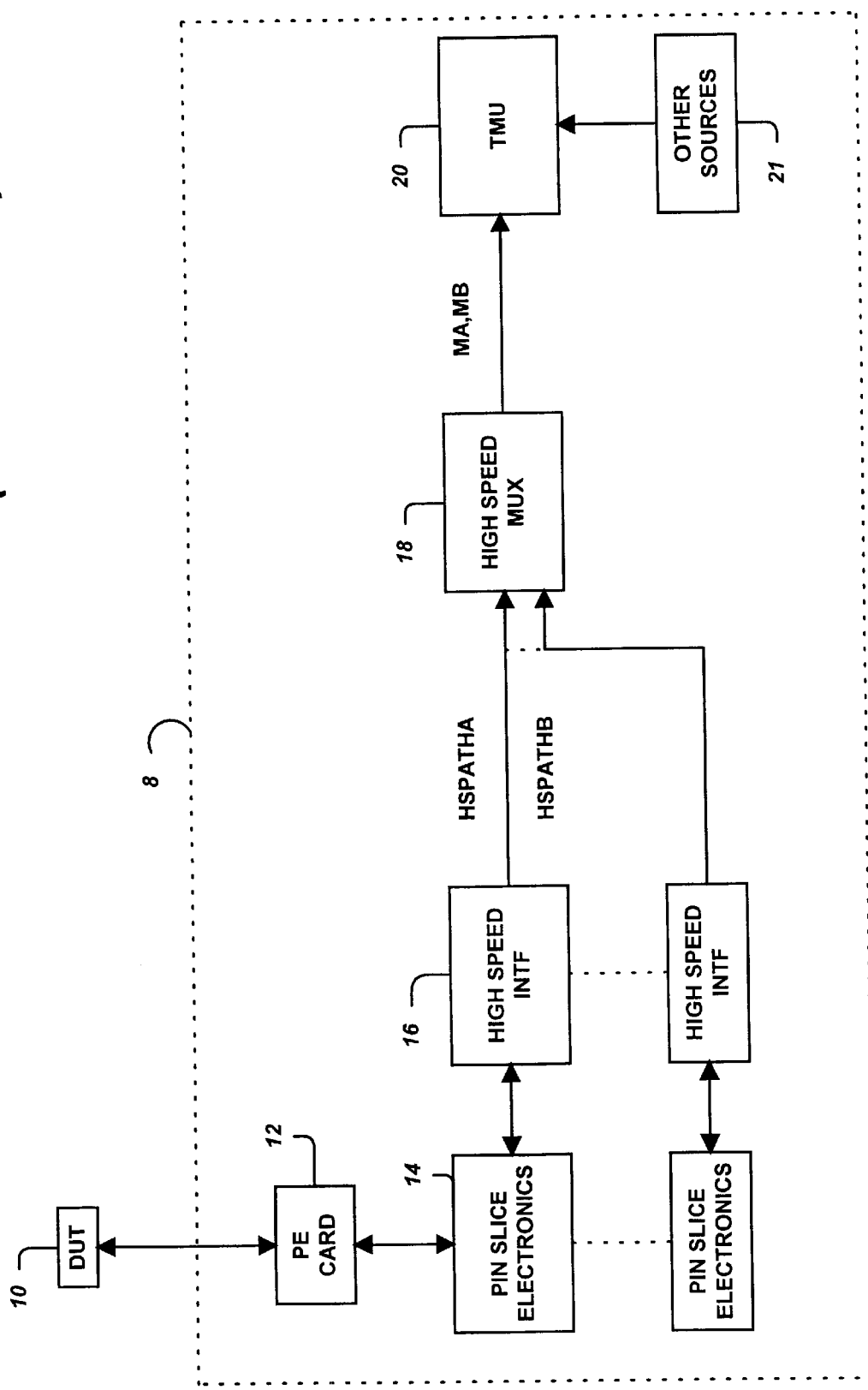
FIG. 1 is a block diagram of a prior art tester system.
Figure 2:
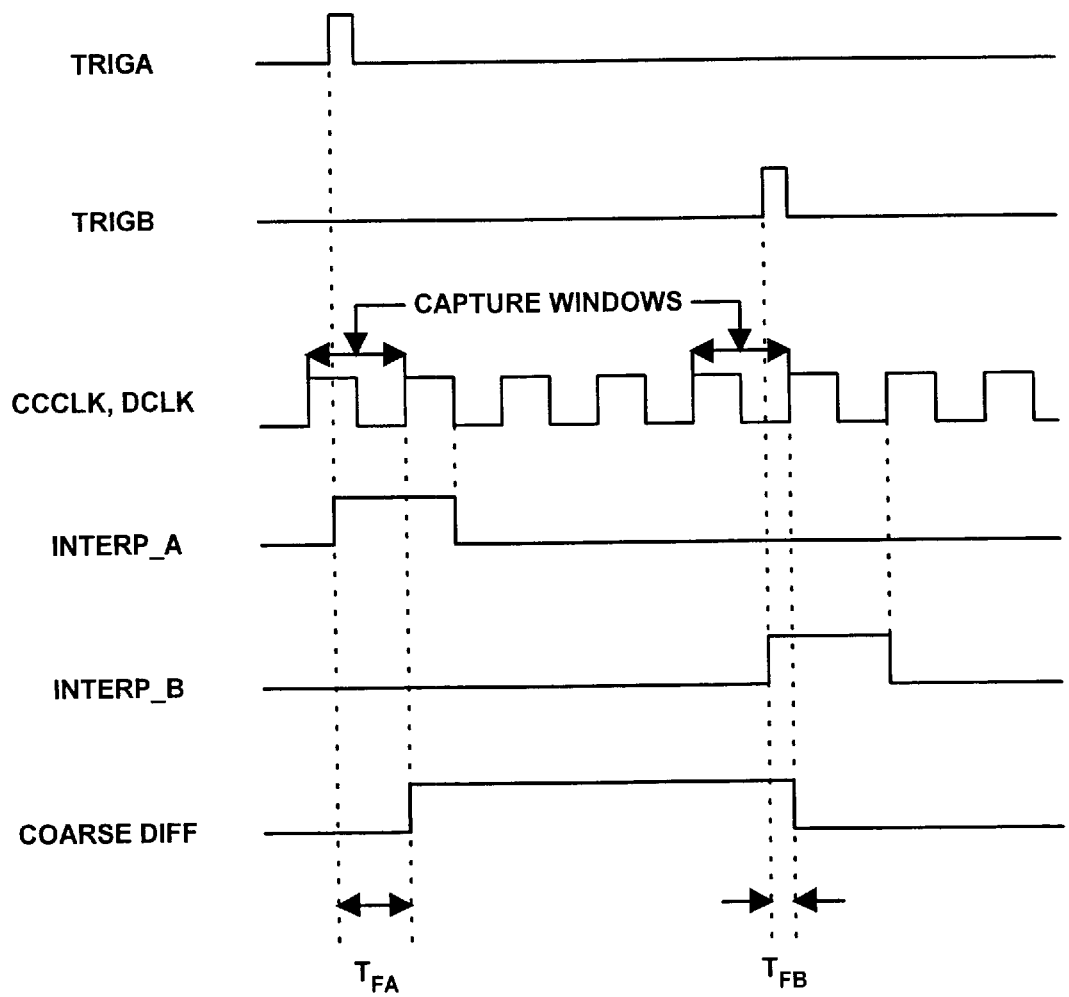
FIG. 2 is a timing diagram showing signals in the prior art tester system.
Figure 5A:
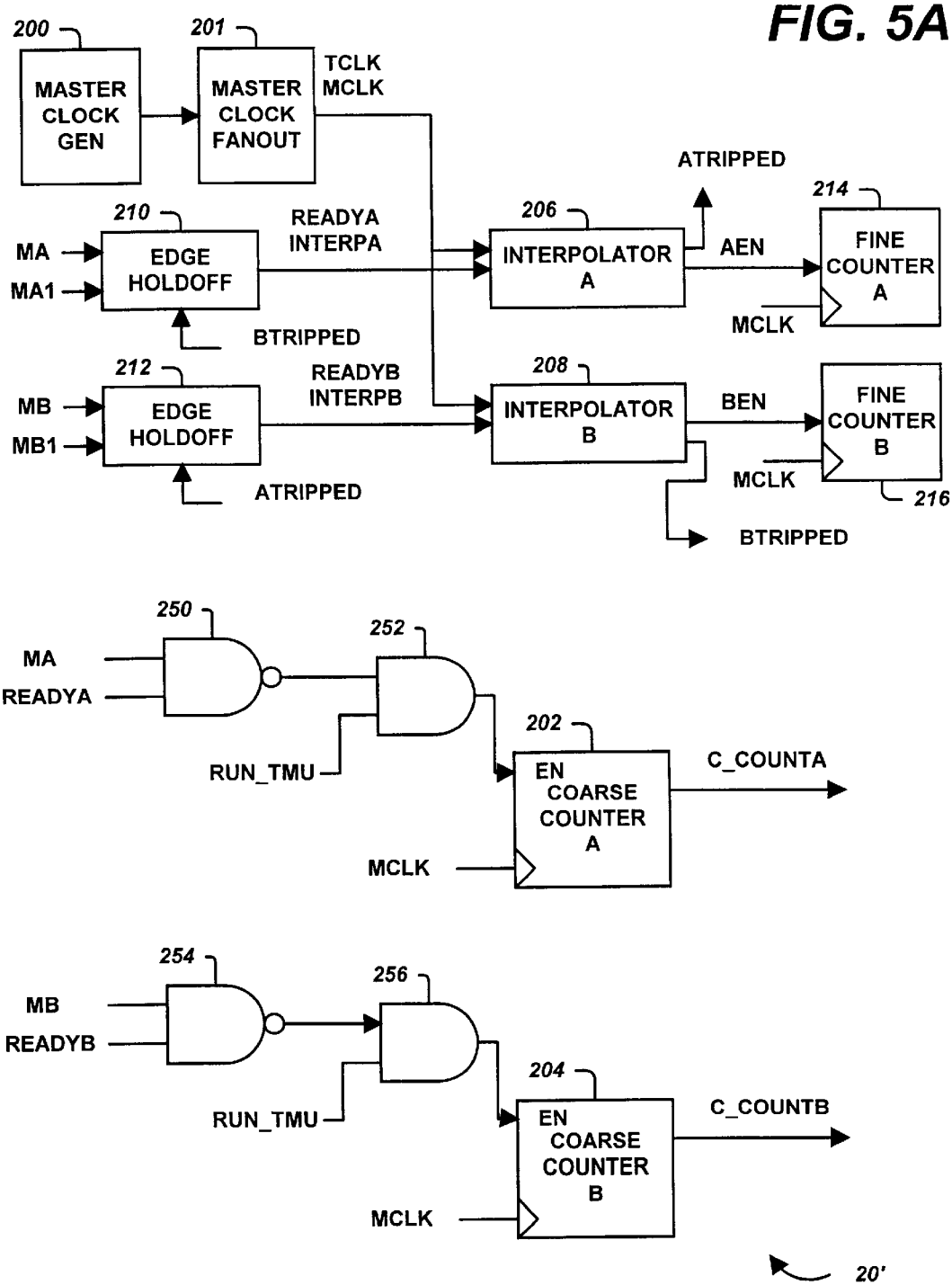
FIG. 5A is a block diagram of a time measurement unit according to the present invention.

Referring to FIG. 5A, an improved time measurement unit (TMU) 20' for use in a tester system, such as the tester system 8 shown in FIG. 1, is shown. If used in the tester system of FIG. 1, TMU 20 is substituted with TMU 20'. Coarse time measurement in the TMU 20' is measured referenced to a global initial event RUN_TMU, which occurs either at the beginning of a test or at some other selected time. Two coarse counters 202 and 204, both clocked by a master clock MCLK, begin counting upon activation of the signal RUN_TMU. The signal RUN_TMU is provided to one input of each of AND gates 252 and 256, whose outputs are connected to the enable input of the coarse counters 202 and 204, respectively. The coarse counters 202 and 204 continue to count until events A and B, respectively, occur. In effect, each coarse counter (working in conjunction with an interpolator 206 or 208) forms an independent time measurement circuit for each timed event.

The coarse counter 202 stops counting when MA occurs, and the coarse counter 204 stops counting when MB occurs. The signal MA is provided to an input of a NAND gate 250, whose output is connected to the other input of the AND gate 252. Similarly, the signal MB is provided to an input of NAND gate 254, whose output is connected to the other input 256. The NAND gates 250 and 254 also receive signals READYA and READYB, respectively. The signals READYA and READYB (which are non-differential signals), indicate when activated high that the coarse counters 202 and 204, respectively, are ready to measure the time interval between events MA and MB. Signals MA, MB, and RUN_TMU are also non-differential.

To derive the coarse time between the two events (time corresponding to number of leading edges of MCLK between the two events), the count recorded in the counter for the first event is subtracted from the count recorded for the second event. The count difference is multiplied by the period of master clock MCLK (e.g., 2.5 ns) to derive the coarse time difference between events A and B.

In addition to the coarse time measurement using the coarse counters 202 and 204, two fine counters 214 and 216, also clocked by the master clock MCLK, are used to determine the time periods ($T_{fineA}$ and $T_{fineB}$ in FIG. 5B) between the coarse counter boundaries and the leading edges of events A and B (actually INTERPA and INTERPB, which are delayed versions of MA and MB). The time differences $T_{fineA}$ and $T_{fineB}$ can be determined to a fine resolution, such as 0.4 to 0.5 ps, by use of interpolators 206 and 208. The interpolators 206 and 208 are controlled by master clocks MCLK and TCLK, rather than a divided clock, thereby avoiding phase errors associated with divided clocks.

The time difference between event A and event B is thus calculated according to Equation 2.

$$\text{TimeA to B} = (\text{Tper} * \text{CCOUNTA} - \text{Tper} * \text{CCOUNTB}) - (\text{CONV\_FACTOR} * \text{FCOUNTA} - \text{CONV\_FACTOR} * \text{FCOUNTB}), \quad \text{Eq. (2)}$$

where CCOUNTA and CCOUNTB are the count values in coarse counters 202 and 204, respectively; FCOUNTA and FCOUNTB are the count values in fine counters 214 and 216, respectively; Tper is the period of the master clock (e.g., 2.5 ns); and CONV_FACTOR is the resolution provided by the interpolators 206 and 208 (e.g., 0.4 to 0.5 ps). The time differences $T_{fineA}$ and $T_{fineB}$ are calculated as (CONV_FACTOR*FCOUNTA) and (CONV_FACTOR*FCOUNTB), respectively.

The master clocks MCLK and TCLK are provided by master clock buffers 201 driven by a master clock generator 200. An exemplary frequency range for the output signal from the master clock generator 200 is 394 to 400 MHz. The output clock from the generator 200 is provided to master clock buffers 201 to produce multiple master clocks running at the same frequency.

Figure 5B:
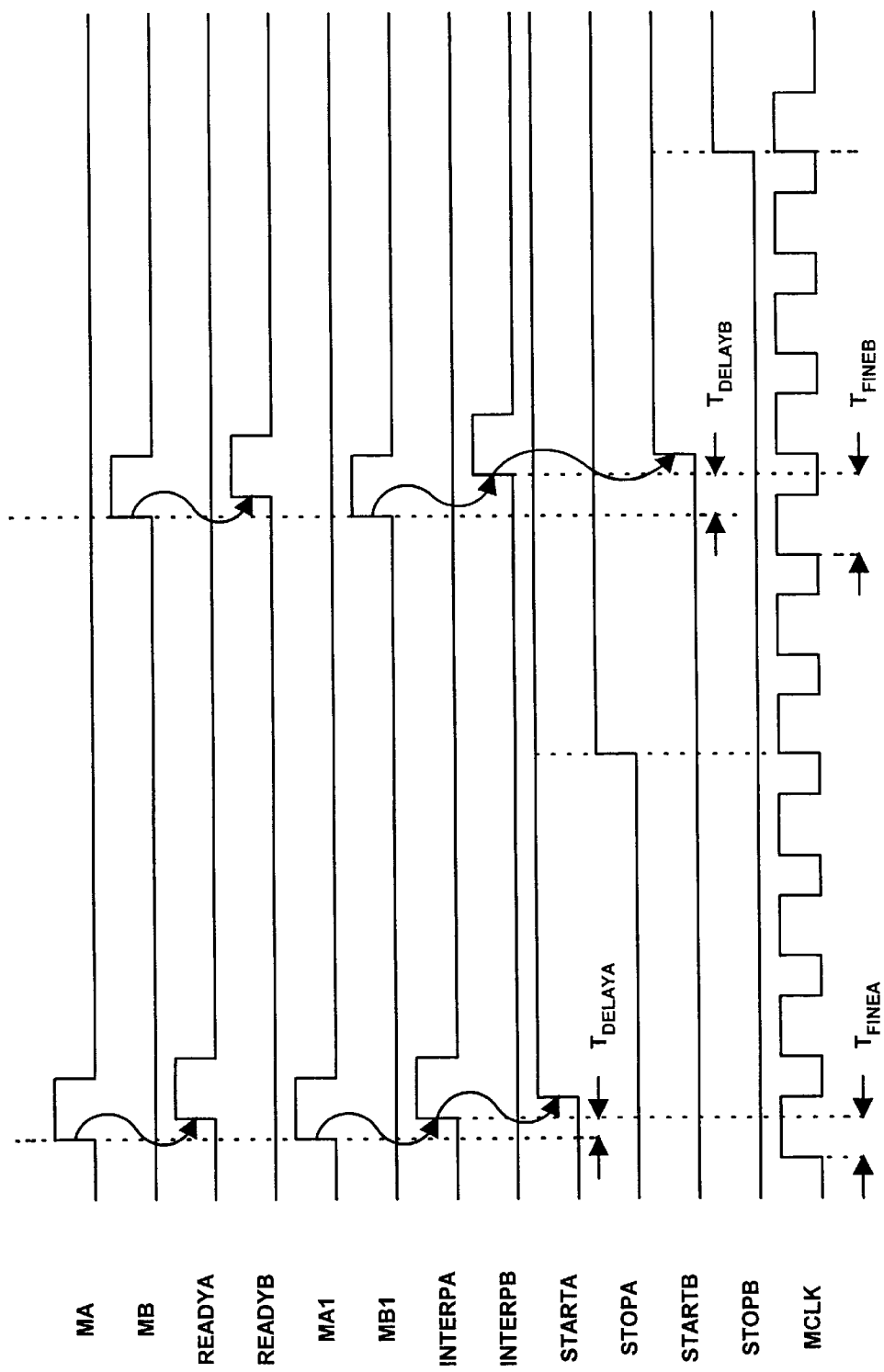
FIG. 5B is a timing diagram showing signals of the time measurement unit according to the present invention.

Edge holdoff circuits 210 and 212, which receive signals MA and MA1 and MB and MB1 from the multiplexer 18, are used to determine which occurrences of MA and MB to measure. MA and MB are non-differential versions of MA1 and MB1. The edge holdoff circuits 210 and 212 generate signals READYA and INTERPA (edge holdoff circuit 210) and READYB and INTERPB (edge holdoff circuit 212), as shown in FIG. 5B. Each edge holdoff circuit includes a delay counter that is initialized to a programmable predetermined value. When the delay counter reaches a terminal count (e.g., zero), assertion of the signal READYA(B) is enabled. The initial value of the delay counter determines how many events MA or MB are to occur before measurement of the time interval between MA and MB. For example, if the initial value of the delay counters in the coarse counters 202 and 204 is ten, then the time measurement is made between the tenth MA and the tenth MB. The initial values of the delay counters in the two edge holdoff circuits 210 and 212 can be different.

After READYA(B) is activated, the interpolator 206 or 208 is ready to receive event INTERPA(B) from the edge holdoff circuit 210 or 212. Similarly, the coarse counter 202 or 204 is enabled to stop counting in response to activation of MA or MB only after READYA or READYB is asserted.

Figure 3:
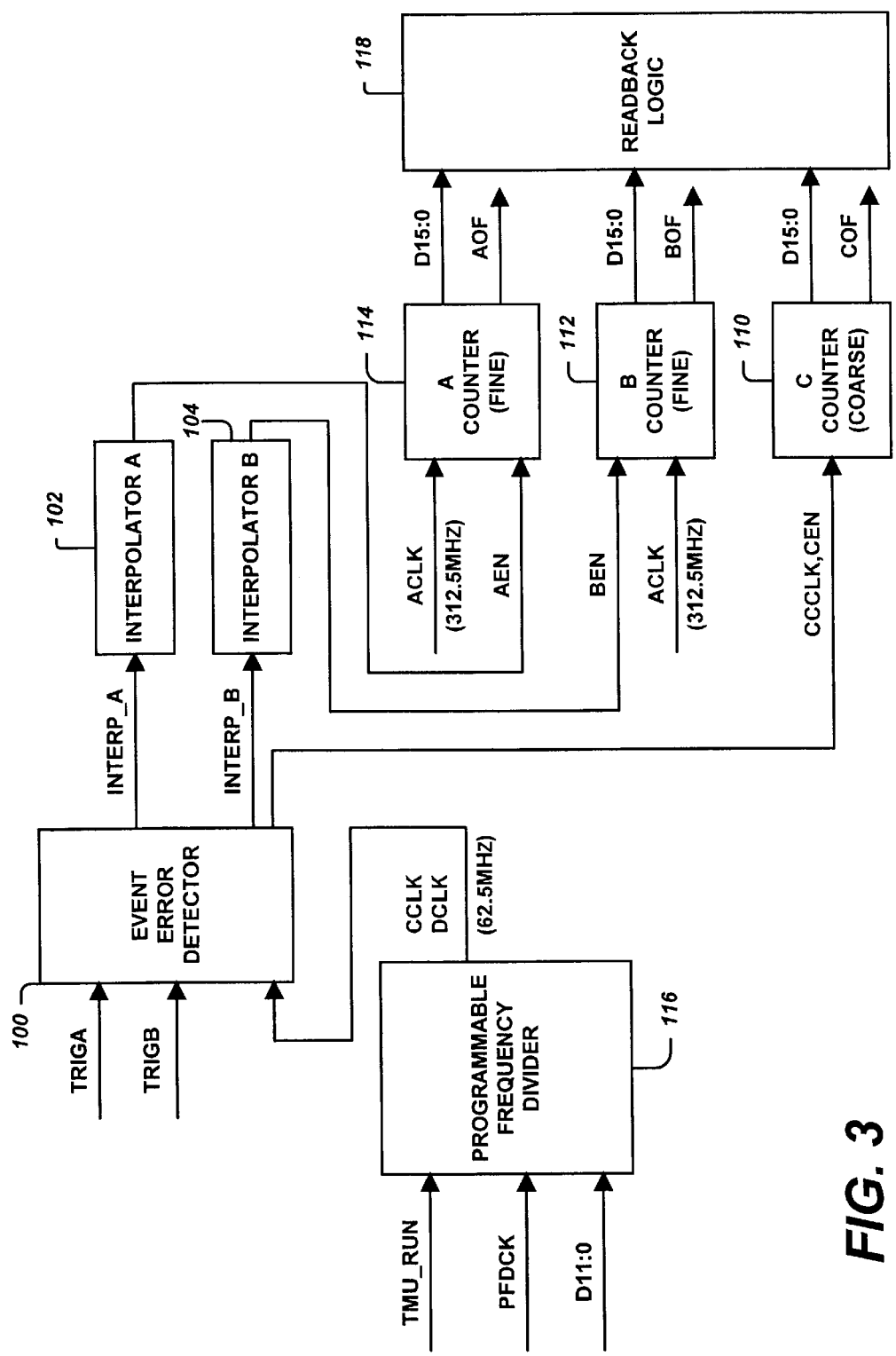
FIG. 3 is a block diagram of components of a time measurement unit used in a prior art tester system.
Figure 4A:
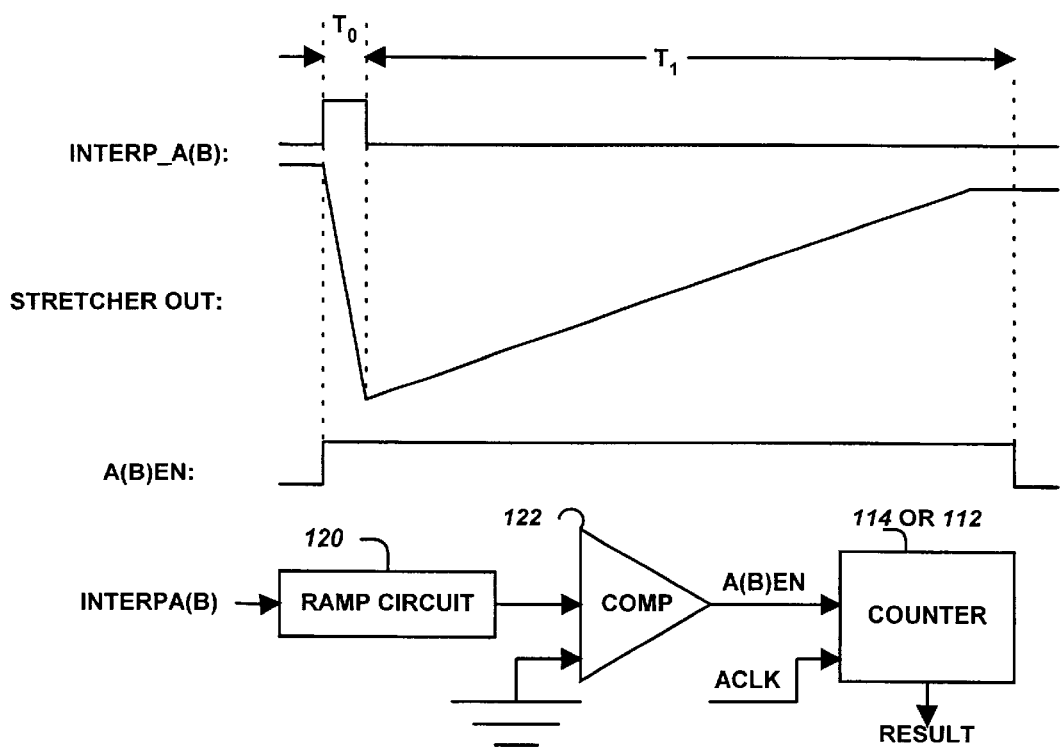
FIGS. 4A and 4B are diagrams showing operation of an interpolator used in the time measurement unit of the prior art tester system.
Figure 4B:
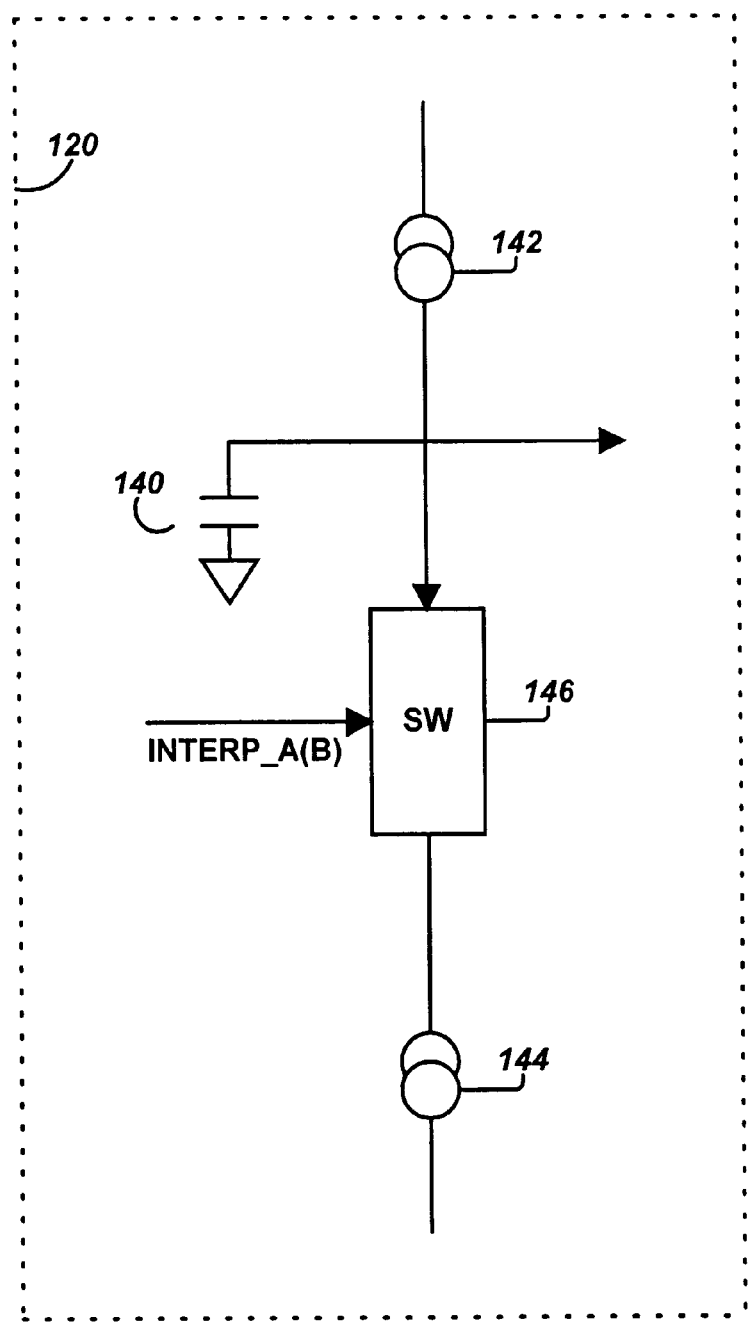
Figure 6:
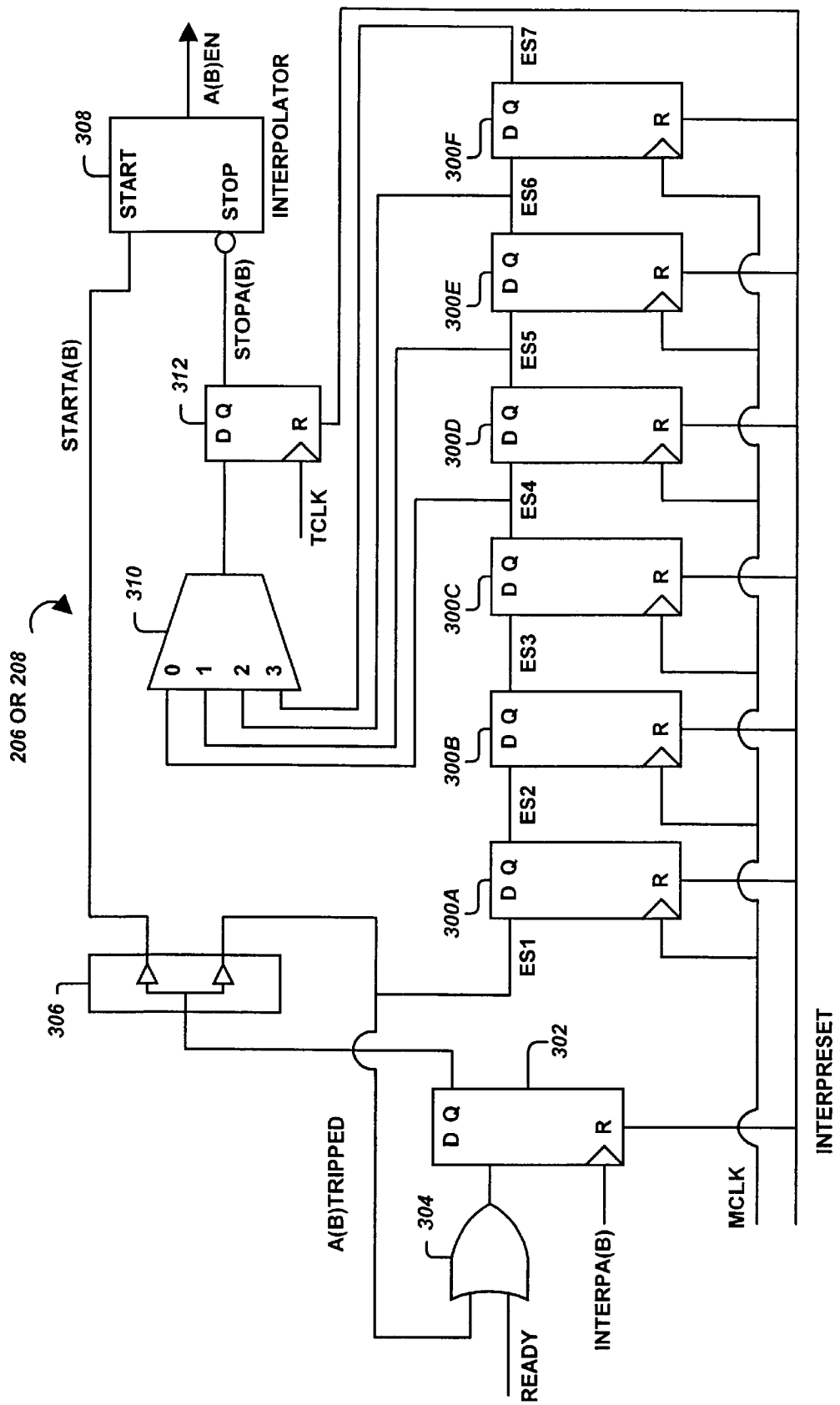
FIG. 6 is a block diagram of an interpolator used in the time measurement unit according to the present invention.

The internal circuitry of each of the interpolators 206 and 208 is shown in FIG. 6. Unlike the interpolators 102 and 104 of FIG. 3, which are controlled by a divided clock DCLK (through signals INTERP_A and INTERP_B from the event error detector 100), the interpolator 206 or 208 in the TMU 20' uses undivided system master clocks MCLK and TCLK. After READYA(B) is asserted, the start event INTERPA(B) (from edge holdoff circuit 210 or 212) initiates a 7-stage shift register including D-type flip flops 300A–F each clocked by the master clock MCLK. A D-type flip flop 302 includes a clock input to receive the event INTERPA(B) to be timed. The data input of the flip flop 302 is connected to an OR gate 304, which receives a signal A(B)TRIPPED and the signal READYA(B). Thus, when the signal READYA(B) is high, the rising edge of INTERPA will cause the flip flop 302 to load a "1" for output to buffers 306. The buffers 306 drive two signals, one to the start input of an interpolator ramp circuit 308, and the other as the signal A(B)TRIPPED. The ramp circuit 308 is similar to the ramp circuit 120 of FIGS. 4A and 4B, except the ramp up and ramp down are controlled differently. The ramp circuit 308 uses distinct Start and Stop input signals (StartA(B) and StopA(B)). The signals READYA and READYB are driven high through flip flop 302 and buffer 306 in response to activation of INTERPA and INTERPB, respectively, as shown in FIG. 5B.

Assertion of the signal A(B)TRIPPED latches a "1" into the flip flop 302, thereby keeping the StartA(B) input of the interpolator ramp circuit 308 activated high. Activation of the Start input causes the interpolator ramp circuit 308 to start ramping up (i.e., charge its capacitor using its large current source).

A programmed number of MCLK clocks later, as determined by the shift register 300A–F and a 4:1 multiplexer 310, the StopA(B) input to the interpolator ramp circuit 308 is activated by a D-type flip flop 312, which is clocked by TCLK, which is identical to MCLK except provided by a different buffer for fan-out purposes. Activation of the StopA(B) input causes the ramp circuit 308 to ramp down (i.e., discharge its capacitor by its tiny current source).

The input of the flip flop 312 is connected to the output of the 4:1 multiplexer 310, which selects outputs from one of flip flops 300C, 300D, 300E, and 300F. During testing operations, the output of the multiplexer 300D is selected by the multiplexer 310. Thus, as shown in FIG. 5B, StopA rises four MCLK clocks after StartA, and similarly, StopB rises four MCLK clocks after StartB.

The outputs of the other flip flops 300C, 300E, and 300F are selected to perform a 4-step calibration measurement (described below). The flip flops in the interpolator 206 or 208 are reset by an INTERPRESET pulse (a non-differential signal).

Thus, the ramp up and ramp down of the interpolator ramp circuit 308 are controlled by a pair of signals StartA(B) and StopA(B) that are a programmed delay apart (as set by the multiplexer 310). To achieve about 0.4 to 0.5 ps time measurement resolution, the ramp circuit 308 stretches the period of the Start-Stop signal pair by a factor of about 5,000 to 6,000.

Figure 7:
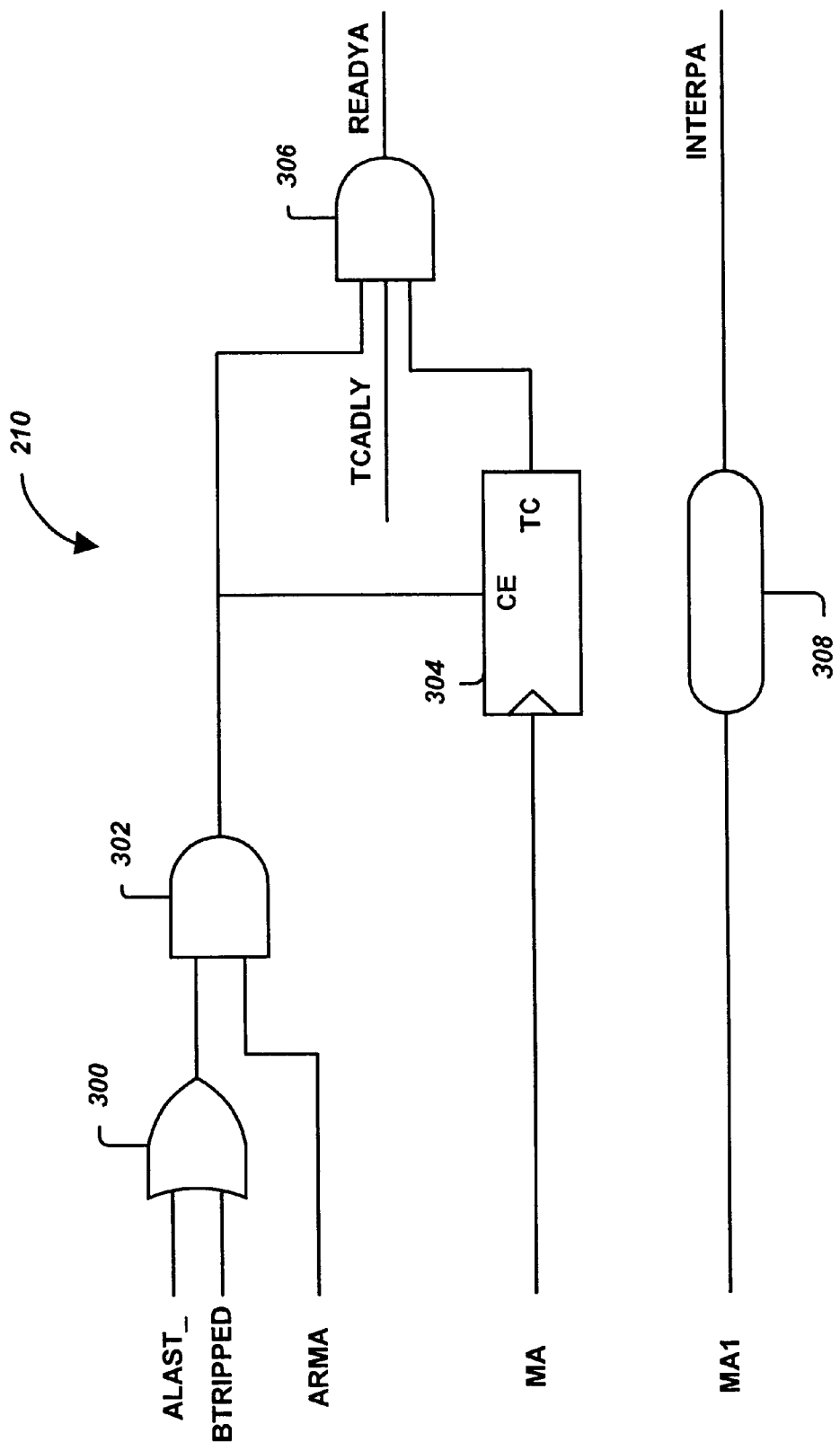
FIG. 7 is a logic diagram of a delay circuit used in the interpolator of the time measurement unit according to the present invention.

Referring to FIG. 7, the edge holdoff circuit 210 is shown. A delay counter 304 is clocked by MA, and is initialized with a predetermined value so that the time measurement occurs after the predetermined number of the event MA has occurred. When the delay counter 304 reaches its terminal count value TC (e.g., zero), it outputs a high to one input of the three-input AND gate 306. The AND gate 306 also receives TCADLY (an enable signal) and the output of a two-input AND gate 302. The AND gate 302 receives a signal ARMA (activated high by the tester system to enable time measurement) and the output of a two-input OR gate 300. The OR gate 300 receives a signal ALAST_ (activated low to indicate that event A is the last occurring event) and the signal BTRIPPED (activated high by the interpolator 208 to indicate that it has tripped). Thus, READYA is not enabled unless it is the first occurring event (ALAST_ is high) or event B has tripped the interpolator 208.

The edge holdoff circuit 212 is identical to 210, except that signals ALAST_, BTRIPPED, ARMA, MA, MA1, READYA, and INTERPA are substituted with BLAST_, ATRIPPED, ARMB, MB, MB1, READYB, and INTERPB, respectively.

The signal MA1 is passed through a delay element 308 for output as INTERPA. The delay length (represented as $T_{delayA}$ in FIG. 5B) is adjusted to allow the signal ATRIPPED from the interpolator 206 to enable the edge holdoff circuit 212 in time to allow measurement of an event B that occurs one ns or more after event A. The reverse is also true; that is, the delay element 308 in the edge holdoff circuit 212 delays INTERPB from MB1 by $T_{delayB}$ to allow the signal BTRIPPED from the interpolator 208 to enable the edge holdoff circuit 210 in time to allow measurement of an event A that occurs one ns or more after event B.

Referring again to FIG. 6, the 4:1 multiplexer 310 is used to select one of four different start-stop time intervals to calibrate the interpolator ramp circuit 308. Assuming a 400 MHz master clock MCLK, selection of output signal ES4 produces a 7.5 ns+Toffset start-stop time interval. Toffset is the additional time from leading edge of INTERPA(B) to the next leading edge of MCLK. During calibration, events MA and MB occur at the same time relationship to a leading edge of MCLK since they are generated from the same clock. As the tester system measures the difference between two events, Toffset is eliminated and it can be assumed to be zero.

Similarly, selection of output signals ES5, ES6, and ES7 produce 10 ns+Toffset, 12.5 ns+Toffset, and 15 ns+Toffset start-stop intervals, respectively. The different start-stop intervals will cause the length of A(B)EN to vary, which in turn causes the count of the fine counter 214 and 216 to vary accordingly.

By thus calibrating the interpolator ramp circuit 308, a measurement table can be created to map five counter values to corresponding time values. Since the signal ES5 (output of flip flop 300D in FIG. 6) is selected in normal test operation, the measurement table is constructed by using data points corresponding to between ES5 and ES6. The conversion factor CONV_FACTOR used in Equation 2 can be selected to be between 0.4 ps/count and 0.5 ps/count by adjusting the relative values of the large and tiny current sources in the ramp circuit 308. Once the count values are retrieved from the fine counters 214 and 216 during a normal test operation, the tester system accesses the calibrated measurement table to determine the time period corresponding to the retrieved count values.

Other embodiments are also within the scope of the following claims. For example, other measurement resolutions can be achieved by varying the components of the ramp circuit in the interpolators. The timing measurement unit can be implemented in any other system (e.g., other types of tester systems, measurement devices, computer systems) in which the time difference between events are to be measured. Furthermore, if desired, additional measurement circuits (including a coarse counter and an interpolator) can be added to independently measure additional events.

What is claimed is:

1. An interpolating circuit for use with a counter clocked by a master clock in a tester system, the interpolating circuit comprising:

a shift register clocked by the master clock, the shift register having an input and an output, the input coupled to receive an activation signal, and the output coupled to provide a stop signal, whereby the stop signal is a delayed form of the activation signal;

a ramp circuit having a capacitor, the ramp circuit charging the capacitor in response to receipt of the activation signal, and the ramp circuit discharging the capacitor in response to receipt of the stop signal; and a signal driver connected to the ramp circuit, the signal driver activating an enable signal to the counter when the capacitor is charged to a predetermined voltage.

2. The interpolating circuit of claim 1, wherein the shift register has multiple outputs, one of which is selectively coupled to provide the stop signal to calibrate the ramp circuit.

3. The interpolating circuit of claim 2, wherein coupling to provide the stop signal from different outputs of the shift register produces different count values in the counter.

4. The interpolating circuit of claim 2, wherein the shift register includes sequentially connected flip flops, the flip flops connected to drive the multiple outputs.

5. The interpolating circuit of claim 1, wherein the ramp circuit receives distinct start and stop signals.

* * * * *